(12) United States Patent
Iisaka et al.

(10) Patent No.: US 10,561,050 B2
(45) Date of Patent: Feb. 11, 2020

(54) COMPONENT MOUNTING SYSTEM AND COMPONENT MOUNTING METHOD

(71) Applicant: FUJI CORPORATION, Chiryu (JP)

(72) Inventors: Jun Iisaka, Nisshin (JP); Hidetoshi Ito, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 375 days.

(21) Appl. No.: 15/506,052

(22) PCT Filed: Sep. 2, 2014

(86) PCT No.: PCT/JP2014/073093
§ 371 (c)(1),
(2) Date: Feb. 23, 2017

(87) PCT Pub. No.: WO2016/035145
PCT Pub. Date: Mar. 10, 2016

(65) Prior Publication Data
US 2017/0303448 A1 Oct. 19, 2017

(51) Int. Cl.
*B23P 19/00* (2006.01)
*H05K 13/00* (2006.01)

(52) U.S. Cl.
CPC .... *H05K 13/0069* (2013.01); *Y10T 29/53187* (2015.01)

(58) Field of Classification Search
CPC ............. H05K 13/0069; H05K 13/086; H05K 13/0857; H05K 13/085; H05K 13/021;
(Continued)

(56) References Cited

U.S. PATENT DOCUMENTS 5,104,277 A * 4/1992 Bullock ............. H05K 13/0061
198/345.1
5,979,045 A * 11/1999 Nishimori ............ H05K 13/021
29/832
(Continued)

FOREIGN PATENT DOCUMENTS

JP 5-177473 A 7/1993
JP 2000-59090 A 2/2000
(Continued)

OTHER PUBLICATIONS

International Search Report dated Dec. 2, 2014 in PCT/JP2014/073093 filed Sep. 2, 2014.
(Continued)

*Primary Examiner* — Donghai D Nguyen
(74) *Attorney, Agent, or Firm* — Oblon, McClelland, Maier & Neustadt, L.L.P.

(57) ABSTRACT

A component mounting system comprising a feeder stocking area in which feeders to be exchanged with feeders for which exchanging is necessary from among multiple feeders which are set in the feeder setting area of each of the component mounting machines are caused to wait; and an exchanging robot which removes the feeders for which exchanging is necessary from the feeder setting area of each of the component mounting machines, removes the feeders to be exchanged with the feeders for which exchanging is necessary from among the multiple feeders which wait in the feeder stocking area, and sets the feeders in the feeder setting area of the component mounting machine.

7 Claims, 12 Drawing Sheets

(58) Field of Classification Search
CPC ............ H05K 13/0495; H05K 13/0417; Y10T 29/4913; Y10T 29/53174; Y10T 29/53178; Y10T 29/53187
USPC .......................................... 29/832, 740, 742
See application file for complete search history.

(56) References Cited

U.S. PATENT DOCUMENTS

| | | | |
|---|---|---|---|
| 8,151,449 B2 * | 4/2012 | Coots | H05K 13/0452 29/739 |
| 2008/0163484 A1 | 7/2008 | Coots et al. | |

FOREIGN PATENT DOCUMENTS

| | | |
|---|---|---|
| JP | 2005-216965 A | 8/2005 |
| JP | 2007-287932 A | 11/2007 |
| JP | 2008-243890 A | 10/2008 |
| JP | 2009-130160 A | 6/2009 |
| JP | 2011-146551 A | 7/2011 |
| WO | WO 2014/010084 A1 | 1/2014 |
| WO | WO 2014/068712 A1 | 5/2014 |
| WO | WO 2014/118995 A1 | 8/2014 |

OTHER PUBLICATIONS

Extended European Search Report dated Jul. 31, 2017 in Patent Application No. 14901294.0.

* cited by examiner

COMPONENT MOUNTING SYSTEM AND COMPONENT MOUNTING METHOD

TECHNICAL FIELD

The present application relates to a component mounting system and a component mounting method in which feeder exchange work is automated.

BACKGROUND ART

For example, as described in PTL 1 (JP-A-2011-146551), PTL 2 (JP-A-2009-130160), and PTL 3 (JP-A-2008-243890), in a component mounting system that sequentially conveys a circuit board to multiple component mounting machines to produce a component mounted board, in a case in which the board type to be produced is switched, after completing the production of the preceding board type, an operator performs feeder exchange work in which a feeder which is not used in the production of the next board type is removed from among multiple feeders which are set on a feeder setting base of the component mounting machines, and a feeder used in the production of the next board type is set on the feeder setting base of the component mounting machine, and the production of the next board type is started after this feeder exchange work is completed.

CITATION LIST

Patent Literature

PTL 1: JP-A-2011-146551
PTL 2: JP-A-2009-130160
PTL 3: JP-A-2008-243890

SUMMARY

In the above-described setup changing method of the related art, after the operator finishes the production of the previous board type, since the operator starts the production of the next board type after performing the feeder exchange work, there is a drawback in that the productivity is lowered due to a delay in the production starting time of the next board type by the time of the feeder exchange work which is performed by the operator.

Therefore, the inventors of the present disclosure researched and developed an automatic feeder exchanging system which automates the feeder exchange work; however, even in this case, since the production of the next board type is started after performing the feeder exchange work after completing the production of the previous board type, it is necessary to take time to perform the feeder exchange work after completing the production of the previous board type and before the production of the next board type, and a situation in which the productivity is lowered by the time of the feeder exchange work is not changed.

Therefore, the problem to be solved by the present disclosure is to provide a component mounting system and a component mounting method which are capable of swiftly switching from the production of the previous board type to the production of the next board type, and capable of improving productivity.

In order to solve the problem described above, the present disclosure is directed to a component mounting system and a component mounting method which sets multiple feeders to be capable of being exchanged in respective feeder setting areas of multiple component mounting machines which are arranged along a conveyance path of a circuit board, conveys the circuit board to the multiple component mounting machines in order and mounts components which are supplied from the multiple feeders onto the circuit board using each of the component mounting machines to produce a component mounted board, in which the component mounting system includes a feeder stocking area in which feeders to be exchanged with feeders for which exchanging is necessary from among multiple feeders which are set in the feeder setting area of each of the component mounting machines are caused to wait, and an exchanging robot which removes the feeders for which exchanging is necessary from the feeder setting area of each of the component mounting machines, removes the feeders to be exchanged with the feeders for which exchanging is necessary from among the multiple feeders which wait in the feeder stocking area, and sets the feeders in the feeder setting area of the component mounting machine, in which in a case in which a board type to be produced in each of the component mounting machines is switched, the exchanging robot performs feeder exchange work before board type switching in parallel with component mounting work onto a final circuit board before the board type switching, and in the feeder exchange work before the board type switching, the exchanging robot removes feeders which are not used in production after the board type switching from among feeders for which supplying of components which are necessary for component mounting work onto a final circuit board of the production during production before board type switching is completed from the feeder setting area of the component mounting machine and collects the feeders which are not used in the production in the feeder stocking area, and removes the feeders which are used in the production after the board type switching from the feeder stocking area and sets the feeders in the feeder setting area of the component mounting machine.

In the present disclosure, in a case in which the board type to be produced in each of the component mounting machines is switched using the automatic feeder exchanging system which automatically exchanges the feeders using the exchanging robot, the feeder exchange work before the board type switching is performed in parallel with the component mounting work onto the final circuit board before the board type switching, and in the feeder exchange work before the board type switching, the feeders which are not used in the production after the board type switching, from among the feeders for which the supplying of the components which are necessary for the component mounting work onto the final circuit board of the production during the production before the board type switching is completed, are removed from the feeder setting area of the component mounting machine, and the feeders which are used in the production after the board type switching are set in the feeder setting area of the component mounting machine, and thus, it is possible to swiftly perform the switching from the production (the production of the previous board type) before the board type switching to the production (the production of the next board type) after the board type switching, and it is possible to improve the productivity.

Incidentally, if the number of the feeders for which exchanging is necessary is small at the time of the board type switching, all of the feeders for which exchanging is necessary may be exchanged before the component mounting work onto the final circuit board before the board type switching is completed; however, when the number of the feeders for which exchanging is necessary becomes large at the time of switching board types, there is a case in which the exchanging of only a portion of the feeders among the feeders for which exchanging is necessary may be performed before the component mounting work onto the final circuit board before the board type switching is completed.

In this case, a configuration may be adopted in which the final circuit board is carried out and the first circuit board after the board type switching is carried in when the component mounting work onto the final circuit board before the board type switching is completed, even in a case in which feeders for which exchanging is necessary are not yet exchanged and remain at this time, each of the component mounting machines starts the component mounting work onto the first circuit board using feeders which supply component which are necessary for production after the board type switching from among the multiple feeders which are set in the feeder setting area of the component mounting machine, and in a case in which the feeders for which exchanging is necessary remain after the board type switching in each of the component mounting machines, the exchanging robot performs, in parallel with the component mounting work onto the first circuit board after the board type switching, the feeder exchange work after the board type switching in which the feeders for which exchanging is necessary are removed from the feeder setting area of the component mounting machine and are collected in the feeder stocking area, and the feeders which are used in the production after the board type switching are removed from the feeder stocking area and are set in the feeder setting area of the component mounting machine.

In this manner, even in a case in which only a portion of the feeders among the feeders for which exchanging is necessary may be exchanged before the component mounting work onto the final circuit board before the board type switching is completed, when the component mounting work onto the final circuit board before the board type switching is completed, the final circuit board is carried out, the first circuit board after the board type switching is carried in, the component mounting work onto the first circuit board is started, and since it is possible to perform the feeder exchange work after the board type switching which switches the remaining feeders in parallel with the component mounting work onto the first circuit board after the board type switching, even in a case in which the feeders for which exchanging is necessary remain after the production before the board type switching is completed, it is possible to switch to the production after the board type switching straight away. Accordingly, the necessity to wait for the completion of the feeder exchange work when switching from the production before the board type switching to the production after the board type switching is completely nullified, and it is possible to seamlessly switch the production.

In the present disclosure, the feeder exchange work before the board type switching and the feeder exchange work after the board type switching may be performed using the single exchanging robot; however, when the number of the feeders for which the exchanging is necessary becomes great, there is a case in which the feeder exchange work is not completed before the component mounting work onto the first circuit board after the board type switching is completed.

As a countermeasure to this, in the present disclosure, a configuration may be adopted in which two exchanging robots which perform feeder exchange work before and after the board type switching in relation to two adjacent component mounting machines are provided, and, in parallel with an operation in which the feeder exchange work before the board type switching is performed using one of the exchanging robots on the component mounting machine into which the final circuit board before the board type switching is carried, the feeder exchange work after the board type switching is performed using the other exchanging robot on the component mounting machine into which the first circuit board after the board type switching is carried. In this manner, in parallel with two adjacent component mounting machines performing the component mounting work onto the final circuit board before the board type switching and the component mounting work onto the first circuit board after the board type switching, it becomes possible to perform the feeder exchange work before the board type switching and the feeder exchange work after the board type switching at the same time using the two exchanging robots on the two component mounting machines, and even in a case in which the number of the feeders for which exchanging is necessary is great to a certain degree, it is possible to seamlessly switch the production, and it is possible to increase the number of exchanges of the feeders for which it is possible to seamlessly switch the production.

The present disclosure may adopt a configuration in which an identification information recording section which records or stores feeder identification information is provided in the feeder, in which an identification information reading section which reads the feeder identification information from the identification information recording section of the feeder which waits in the feeder stocking area is provided in the feeder stocking area, and in which the exchanging robot identifies the feeder based on the feeder identification information which is transmitted from the identification information reading section. In this manner, regardless of the order in which the multiple feeders, which are waiting in the feeder stocking area, are lined up, the feeder to be exchanged based on the feeder identification information from among the feeders may be accurately selected and set in the feeder setting area of the component mounting machine. When the feeder stocking area is restocked with the feeders, since the feeders may be arranged in any order, it is possible to freely restock arbitrary empty spaces (empty slots) with the feeders, and it is possible to easily perform the work of restocking the feeders even in a case in which the operator restocks the feeder stocking area with the feeders.

The present disclosure may adopt a configuration in which component remaining number management device which manages the number of remaining components on the feeders which are set in the feeder setting area of each of the component mounting machines in association with the feeder identification information is further included, in which the exchanging robot removes used feeders for which it is determined that all components are used up based on management information of the component remaining number management device in each of the component mounting machines from the feeder setting area of the component mounting machine, removes feeders which supply the same components as the used feeders from the feeder stocking area, and sets the feeders in the feeder setting area of the component mounting machine. In this manner, in a case in which the feeder which is removed from the feeder setting area of the component mounting machine is the partially-used feeder with remaining components, the component remaining number is managed in association with the feeder, and since the partially-used feeder may be collected and reused in the feeder stocking area, the components of the feeder may be used up to the last one, and the production cost may be reduced.

The present disclosure may adopt a configuration in which a feeder conveyance conveyor which performs carrying in of feeders with which to restock the feeder stocking area and carrying out of used feeders, and a replacing robot which replaces feeders between the conveyor and the feeder stocking area are further included. In this manner, it is possible to automatically perform the carrying in of the feeder to the feeder stocking area and the carrying out of the used feeders.

The feeder used in the present disclosure may use a cassette-type feeder including a tape loading section into which a wound component supply tape is loaded, a tape feeding mechanism which feeds the component supply tape which is pulled out from the tape loading section to a component suction position, a top film peeling mechanism which peels a top film from the component supply tape before the component suction position and exposes components inside the component supply tape, and a cassette case which houses the tape loading section, the tape feed mechanism, and the top film peeling mechanism. In this manner, if the cassette-type feeder is used, the handling becomes easy during the automatic exchanging.

DESCRIPTION OF EMBODIMENTS

Hereinafter, description will be given of the two Examples 1 and 2 which embody an embodiment of the present disclosure.

First Embodiment

Description will be given of a first embodiment of the present disclosure based on FIGS. 1 to 11. First, description will be given of the configuration of a component mounting system 10 based on FIGS. 1 and 2.

Figure 2:
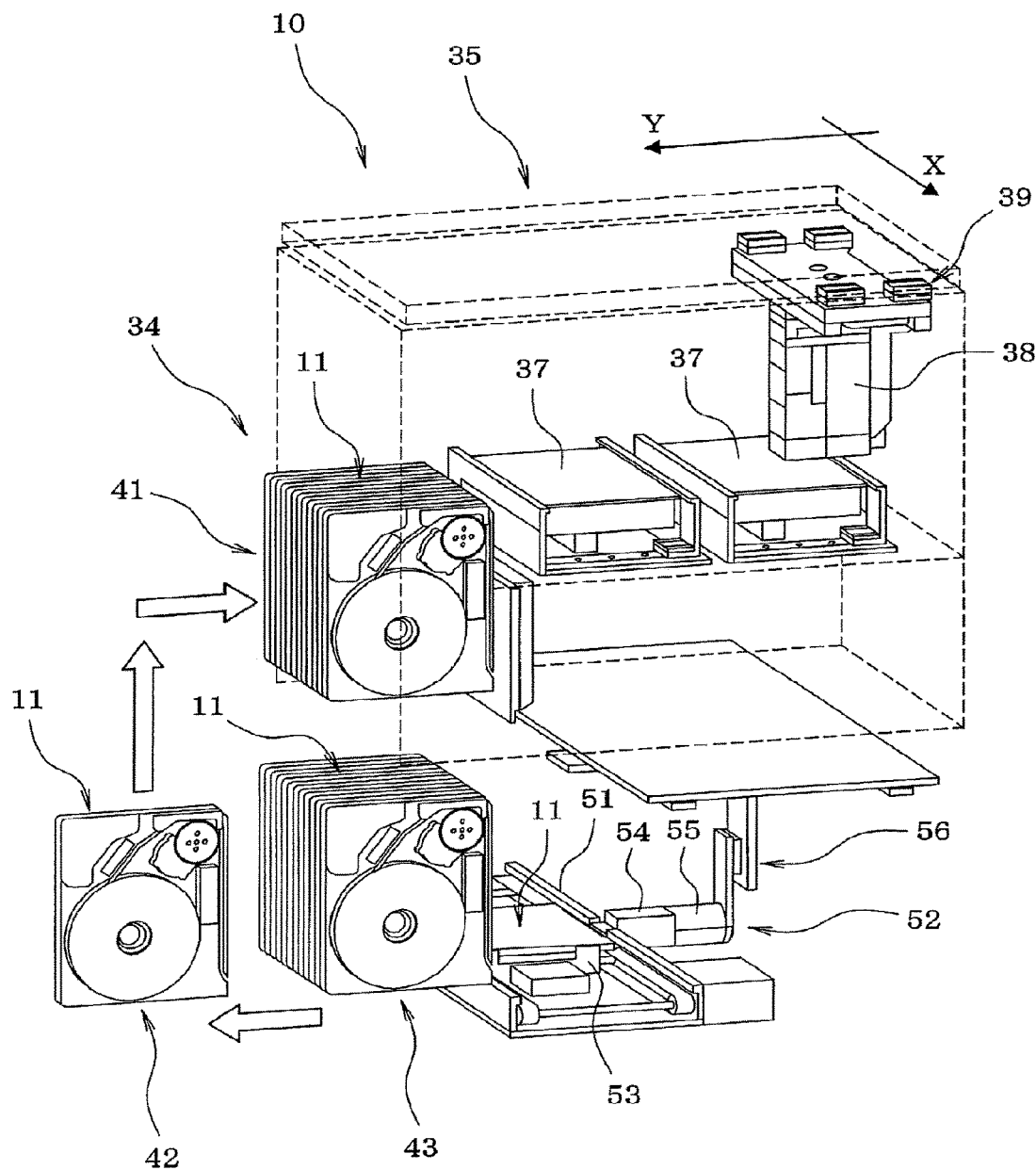
FIG. 2 is a perspective view illustrating the outline of an automatic feeder exchanging system (depiction of an exchanging robot is omitted).
Figure 3:
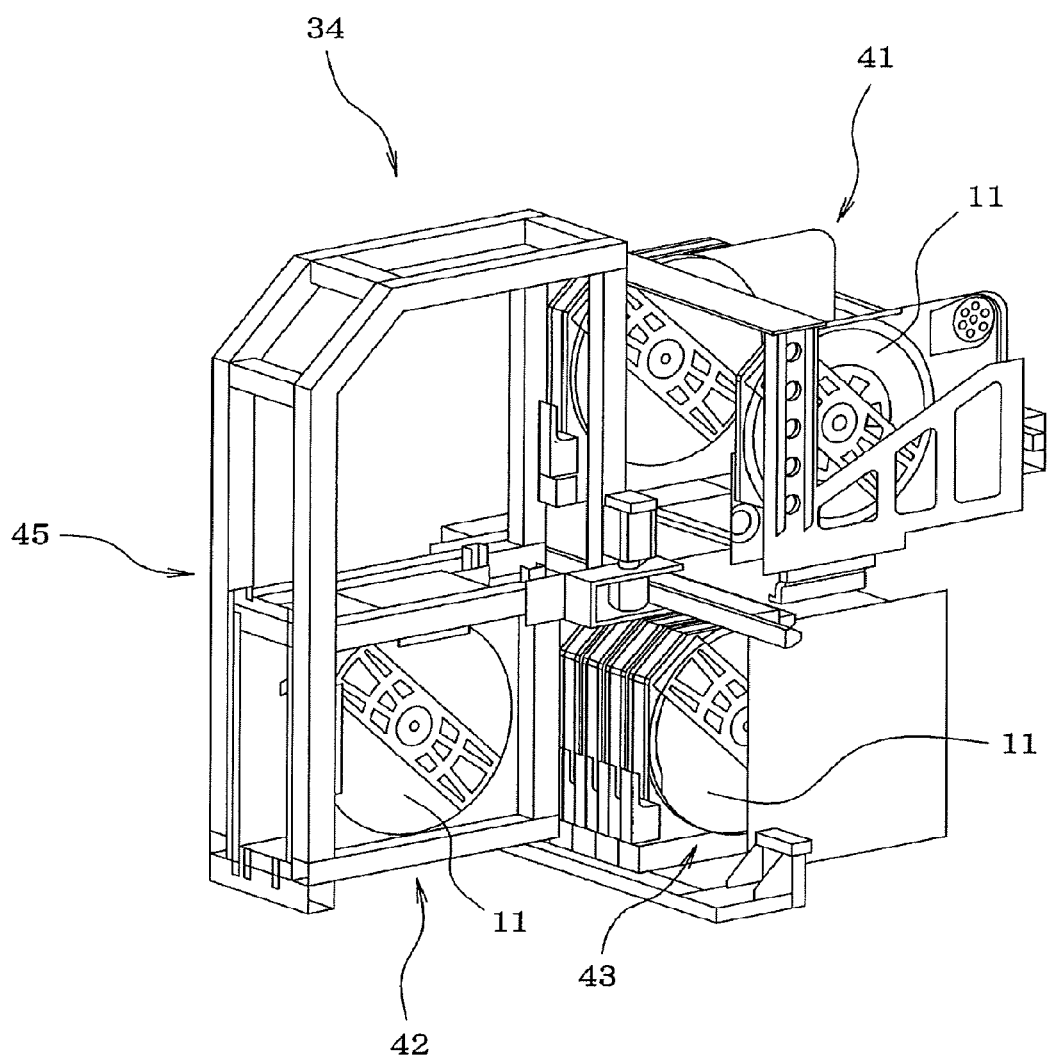
FIG. 3 is a perspective view illustrating the outline of the exchanging robot.
Figure 10:
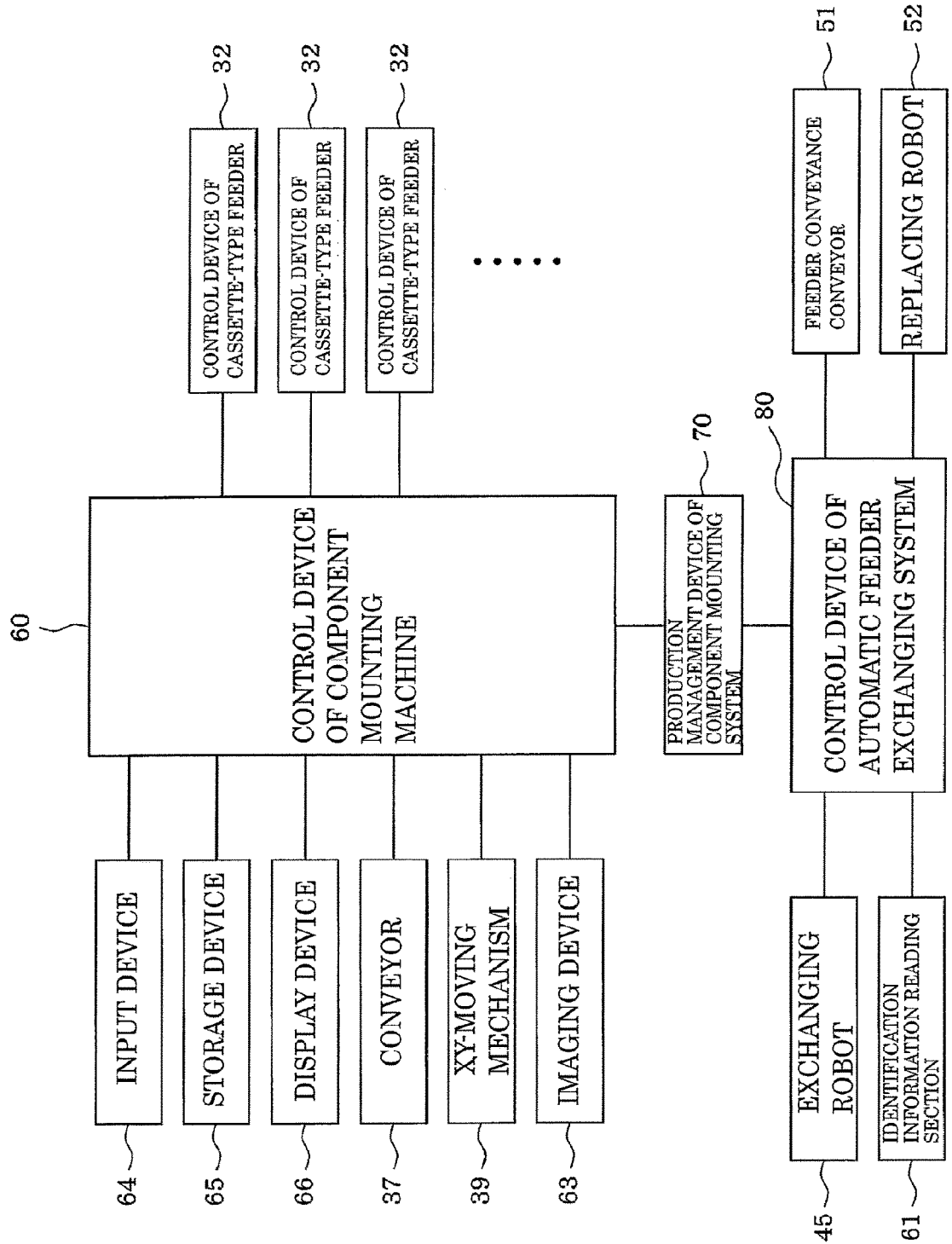
FIG. 10 is a block diagram illustrating a control system of the automatic feeder exchanging system.
Figure 11:
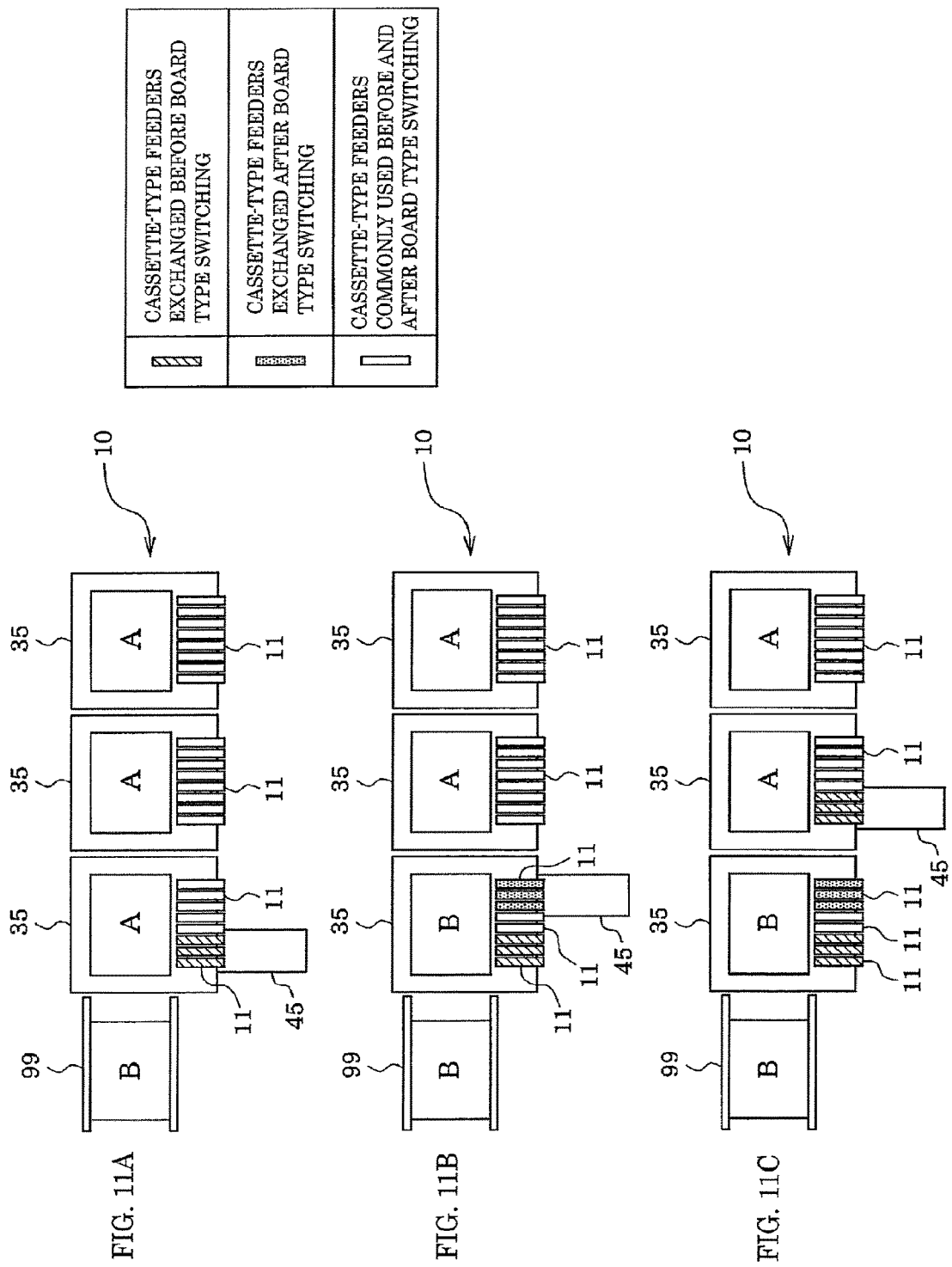
FIG. 11 is a diagram explaining a method of feeder exchange work before and after a switching of board type of the first embodiment.

The component mounting system 10 is configured by arranging multiple component mounting machines 35 along a conveyance direction (an X-direction) of a circuit board. As illustrated in FIG. 2, each of the component mounting machines 35 is provided with two conveyors 37 which convey a circuit board, a mounting head 38 which holds a suction nozzle (not illustrated) which sucks a component which is supplied from a cassette-type feeder 11 to mount the component onto the circuit board, an XY-moving mechanism 39 which causes the mounting head 38 to move in the XY-directions (the left-right and front-back directions), an imaging device 63 (refer to FIG. 10) which images the component which is sucked by the suction nozzle, and the like. Additionally, as illustrated in FIG. 10, an input device 64 such as a keyboard, a mouse, or a touch panel, a storage device 65 (storage device) such as a hard disk, a RAM, or a ROM which stores various programs, various data, and the like for the automatic feeder exchanging, a display device 66 such as a liquid crystal display or a CRT, and the like are connected to a control device 60 of the component mounting machine 35. The display device 66 is installed on the top portion of the front face side of the component mounting machine 35.

Each of the component mounting machines 35 of the component mounting system 10 conveys the circuit board which is conveyed from the component mounting machine 35 on the upstream side to a predetermined position by the conveyors 37 and clamps the circuit board with a clamp mechanism (not illustrated) to position the circuit board, and sucks a component which is supplied from the cassette-type feeder 11 by the suction nozzle of the mounting head 38, moves the component from the suction position to the imaging position, images the component using the imaging device 63, and subjects the component to image recognition to determine the suction posture and the suction position deviation amount of the component, and subsequently mounts the component onto the circuit board on the conveyors 37 to produce the component mounted board.

An automatic feeder exchanging system 34 is installed on the front face side of the component mounting system 10. A feeder setting area 41, a feeder switching area 42, and a feeder stocking area 43 are provided in the automatic feeder exchanging system 34. The feeder setting area 41 is an area which is positioned in front (the Y-direction) of the conveyors 37, and in which the multiple cassette-type feeders 11, which supply components to the component suction positions of the component mounting machines 35, are lined up and set. A connector (not illustrated) for communication and power which is connected to a connector (not illustrated) for communication and power of the cassette-type feeder 11 side is provided in the feeder setting area 41, control signals and the like are transmitted and received between a control device 32 (refer to FIG. 9) inside a cassette case 12 and the control device 60 (refer to FIG. 10) of the component mounting machine 35, and an electrical current flows in the control device 32 and the like inside the cassette case 12 due to the connection of both connectors. The control device 60 of each of the component mounting machines 35 is connected to a production management device 70 (a host computer) which manages the production of the entirety of the component mounting system 10 via a network, and the production of each of the component mounting machines 35 is managed by the production management device 70.

The feeder stocking area 43 is disposed under the feeder setting area 41. The feeder stocking area 43 is an area which stores the next cassette-type feeder 11 to be exchanged with the cassette-type feeder 11 which is inside the feeder setting area 41 and for which exchanging is necessary, and collects the cassette-type feeders 11 which are removed from the feeder setting area 41. Slots in which the cassette-type feeders 11 are set one by one are formed in the feeder stocking area 43 by the number equivalent to the number of feeders which may be accommodated in the feeder stocking area 43, and the feeder stocking area 43 is provided with an identification information reading section 61 (refer to FIG. 10) which reads the feeder ID (the feeder identification information) from an identification information recording section (not illustrated) of the cassette-type feeder 11 which is set in each of the slots, the feeder ID which is read by the identification information reading section 61 is transmitted to a control device 80 of the automatic feeder exchanging system 34 and the production management device 70 of the component mounting system 10, and the component type and the like of the cassette-type feeder 11 which is set in each of the slots is automatically recognized.

In this manner, regardless of the order in which the multiple cassette-type feeders 11, which are waiting in the feeder stocking area 43, are lined up, the cassette-type feeder 11 to be exchanged based on the feeder ID from among the cassette-type feeders 11 may be accurately selected and set in the feeder setting area 41. When the feeder stocking area 43 is restocked with the cassette-type feeders 11, since the cassette-type feeders 11 may be arranged in any order, it is possible to freely restock arbitrary empty spaces (empty slots) with the cassette-type feeders 11, and it is possible to easily perform the work of restocking the cassette-type feeders 11 even in a case in which the operator restocks the feeder stocking area 43 with the cassette-type feeders 11.

In this first embodiment, all of the cassette-type feeders 11 which are removed from the feeder setting area 41 are collected in the feeder stocking area 43; however, the present disclosure is not limited to this configuration, and for example, a configuration may be adopted in which a used feeder collection area (not illustrated) is disposed adjacent to the feeder stocking area 43, the used (component shortage) cassette-type feeders 11 in which all of the components are used up among the cassette-type feeders 11 which are removed from the feeder setting area 41 are collected in the used feeder collection area, and only the partially-used cassette-type feeders 11 in which components remain are collected in the feeder stocking area 43. In this manner, it is possible to separately collect the used cassette-type feeders 11 in which all of the components are used up and partially-used cassette-type feeders 11, and it becomes easy to perform the work of removing the used cassette-type feeders 11 from the component mounting machine 35.

The feeder switching area 42 is disposed in front of the feeder stocking area 43 and the feeder setting area 41, and the cassette-type feeders 11 are switched between the feeder stocking area 43 and the feeder setting area 41 using the feeder switching area 42. An exchanging robot 45 (refer to FIGS. 3 to 8) is provided in the feeder switching area 42. The exchanging robot 45 removes the cassette-type feeder 11 for which exchanging is necessary from the feeder setting area 41 of each of the component mounting machines 35, and removes the cassette-type feeder 11 to be exchanged from among the multiple cassette-type feeders 11 waiting in the feeder stocking area 43 to set the cassette-type feeder 11 in the feeder setting area 41 of the component mounting machine 35.

Figure 1:
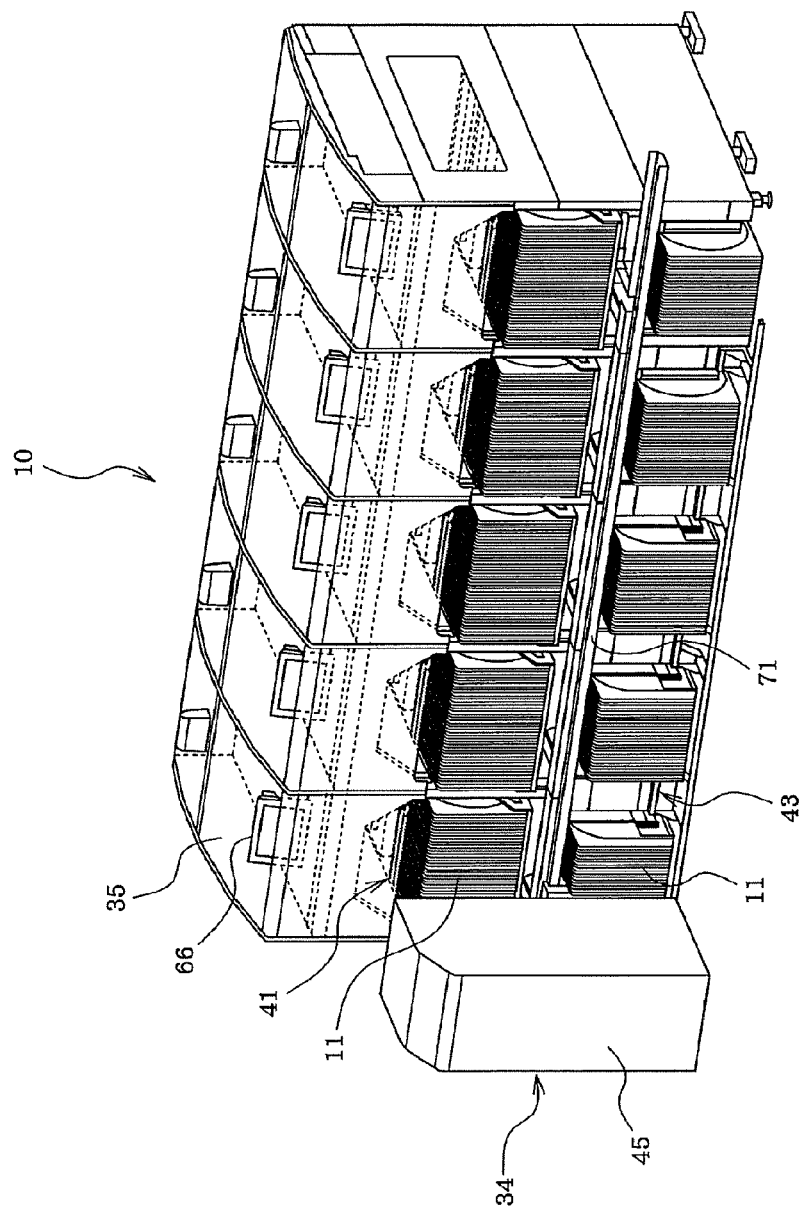
FIG. 1 is a perspective view illustrating the entirety of a component mounting system of a first embodiment of the present invention.
Figure 8:
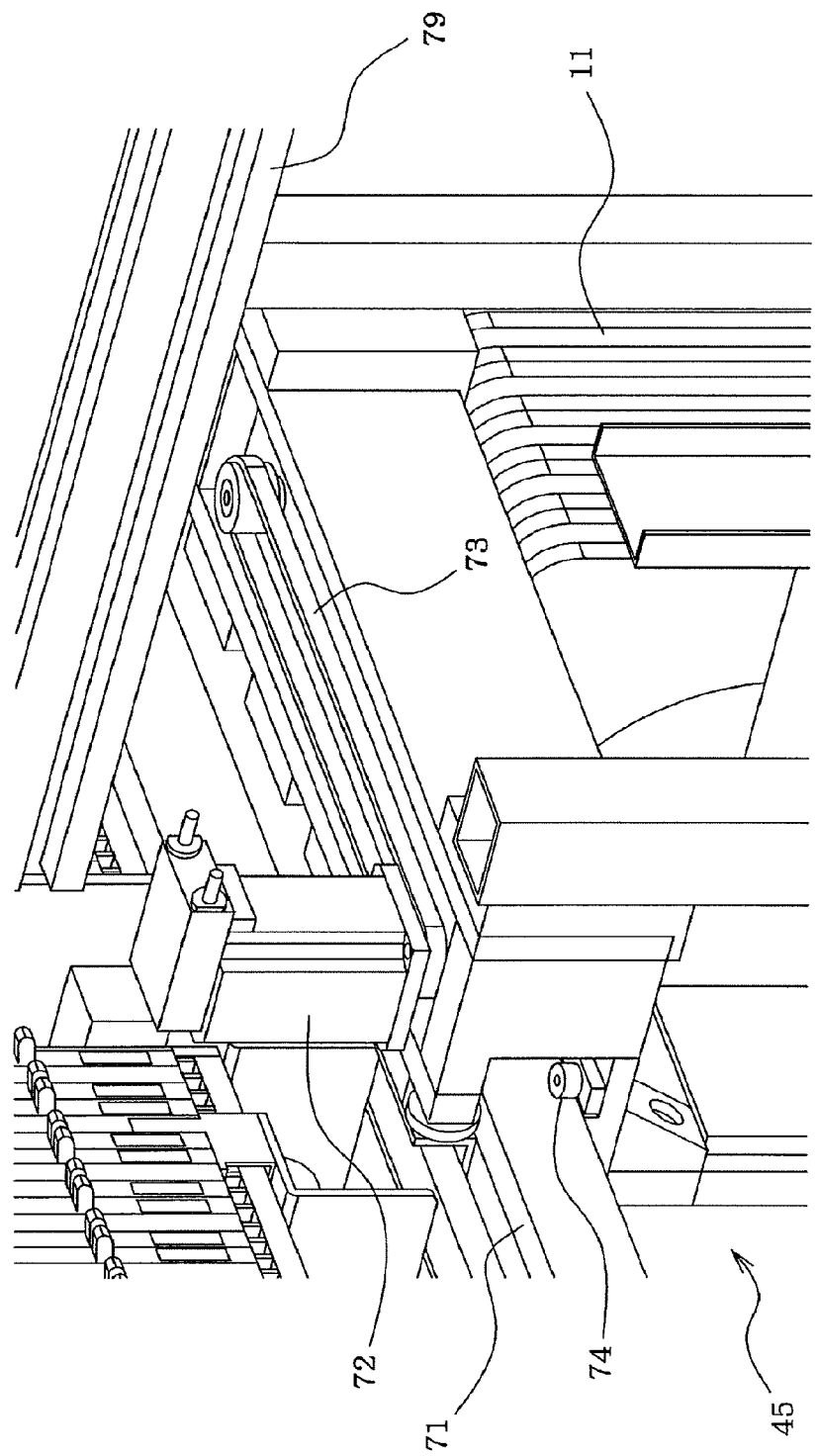
FIG. 8 is a perspective view illustrating an X-axis driving mechanism of the exchanging robot.

Next, description will be given of the configuration of the exchanging robot 45. As illustrated in FIG. 1, on the front face of the component mounting system 10, an X-axis rail 71 which allows the exchanging robot 45 to move in the left-right direction (the X-direction) along the component mounting machines 35 which are lined up so is provided as to extend in the X direction. As illustrated in FIG. 8, an X-axis motor 72 which serves as a driving source which causes the exchanging robot 45 to move along the X-axis rail 71 is provided on the exchanging robot 45, and a configuration is adopted in which the exchanging robot 45 is caused to move in the X-direction by rotationally driving a drive belt 73 using the X-axis motor 72, and the movement of the exchanging robot 45 in the X direction is guided by a guide roller 74.

As illustrated in FIGS. 4 to 7, the exchanging robot 45 is provided with a feeder transfer section 76 which allows removal and insertion, and lifting and lowering of the cassette-type feeder 11. The feeder transfer section 76 is provided with a clamp member 77 which clamps, and removes and inserts the cassette-type feeder 11, a Y-axis motor 78 which serves as a driving source which causes a clamp member 77 to move in the Y-direction (the removal and insertion direction of the cassette-type feeder 11), a Y-axis guide member 79 which guides the movement of the clamp member 77 in the Y direction, and the like.

Figure 4:
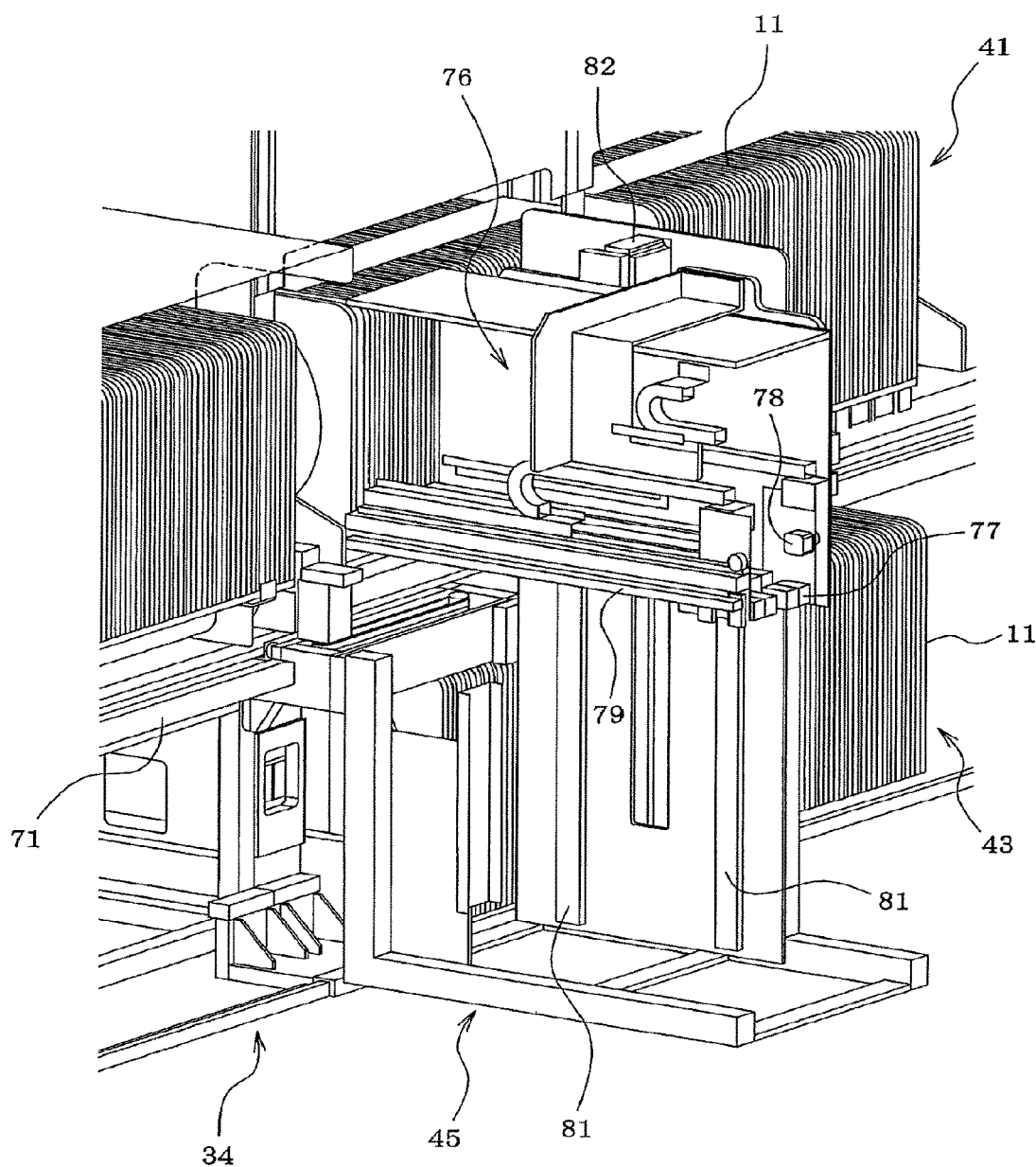
FIG. 4 is a perspective view of the exchanging robot as viewed obliquely from the left side.
Figure 5:
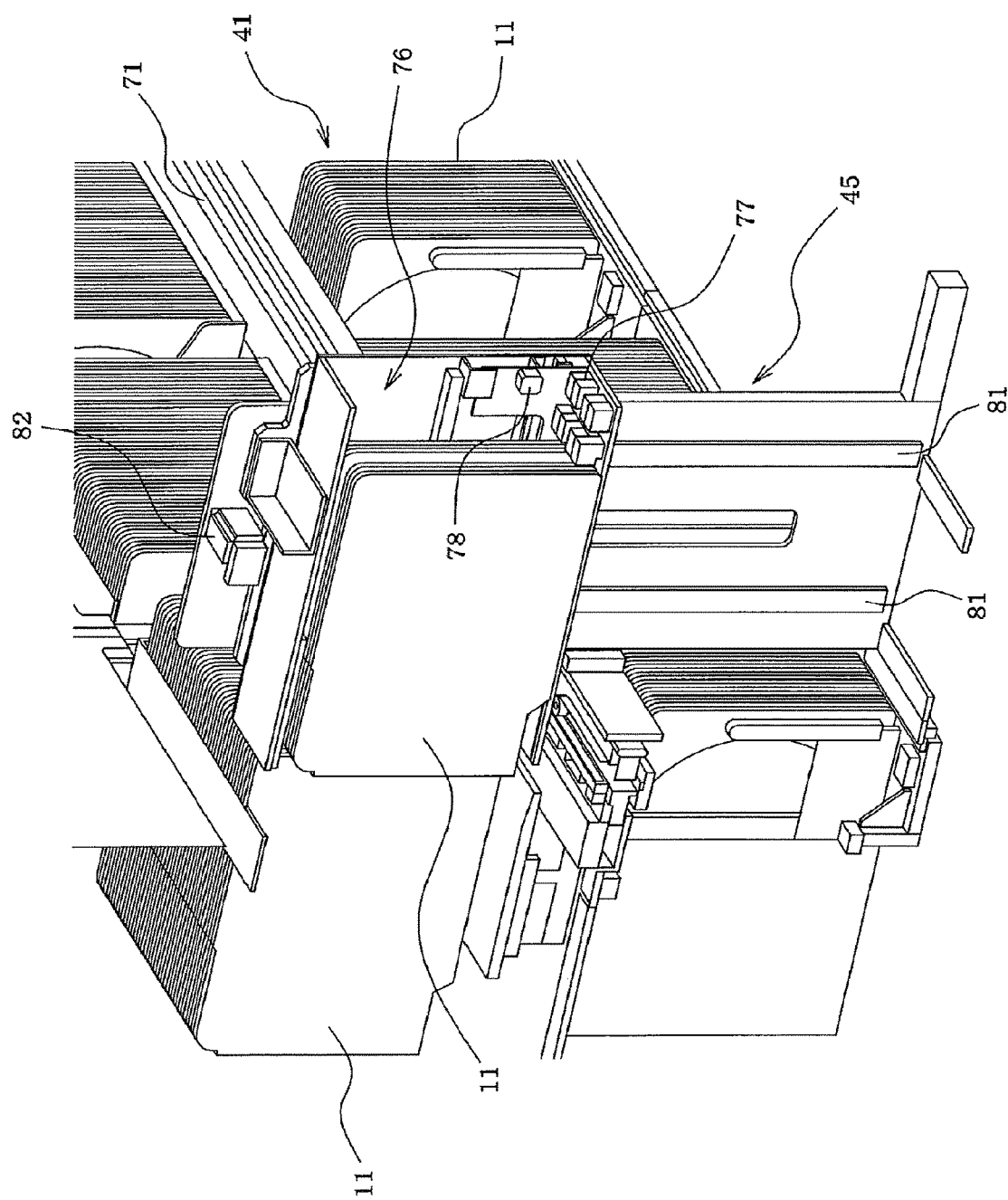
FIG. 5 is a perspective view illustrating a state during a feeder exchanging operation of the exchanging robot.
Figure 6:
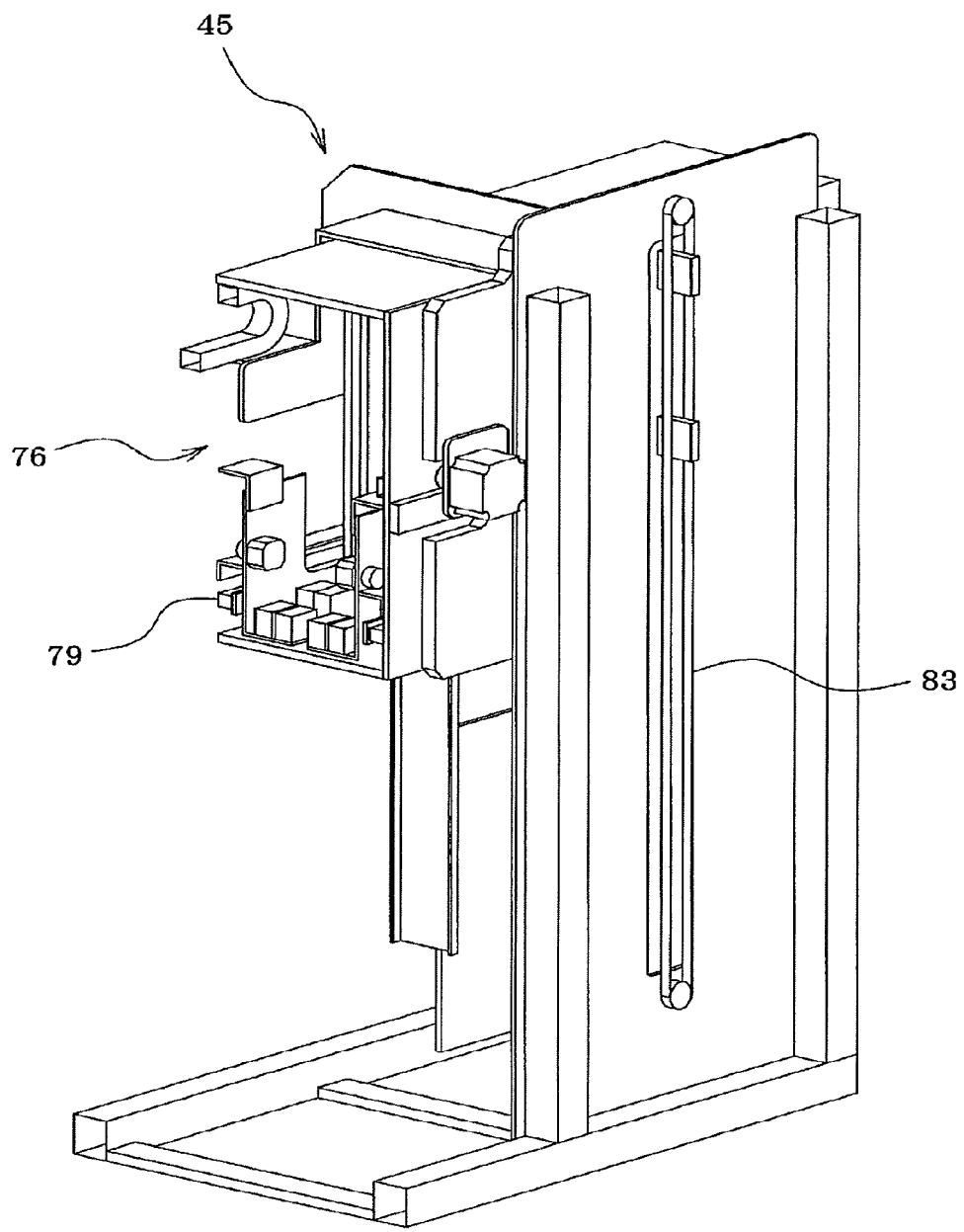
FIG. 6 is a perspective view of the exchanging robot as viewed obliquely from the right side.
Figure 7:
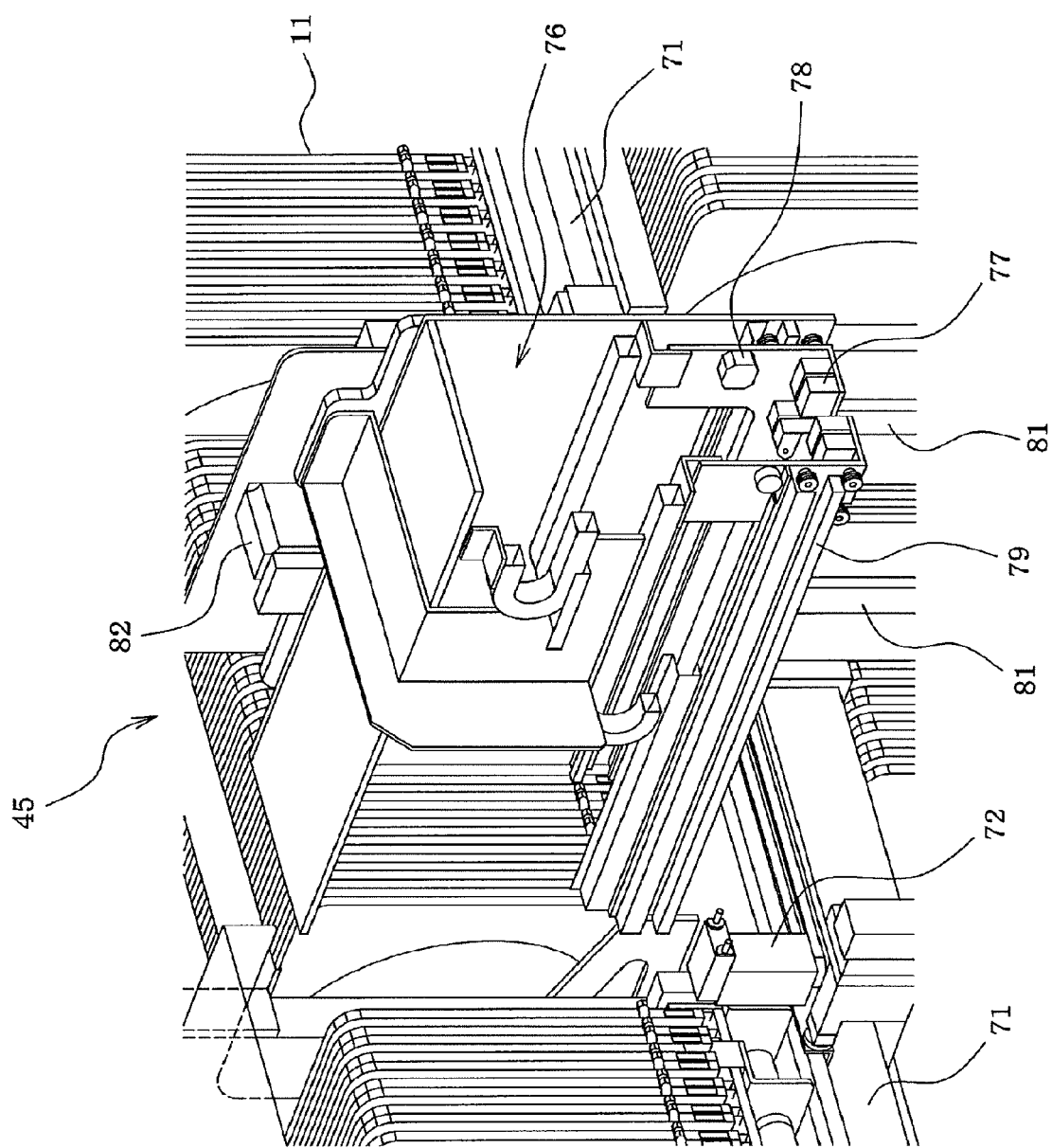
FIG. 7 is a perspective view illustrating a Y-axis driving mechanism of the exchanging robot.

As illustrated in FIGS. 4 and 5, a configuration is adopted in which a Z-axis guide member 81 which guides the lifting and lowering operation of the feeder transfer section 76 and a Z-axis motor 82 which serves as a driving source of the lifting and lowering operation of the feeder transfer section 76 are provided on the side face portion of the exchanging robot 45, and the feeder transfer section 76 is lifted and lowered along a Z-axis guide member 81 by rotationally driving a belt 83 (refer to FIG. 6) using the Z-axis motor 82.

In this first embodiment, a configuration is adopted in which the restocking of the feeder stocking area 43 with the cassette-type feeders 11 is automated. Specifically, as illustrated in FIG. 2, a configuration is adopted in which a feeder conveyance conveyor 51 which performs the carrying in of the cassette-type feeders 11 with which the feeder stocking area 43 is to be restocked and the carrying out of the used cassette-type feeders 11, and a replacing robot 52 which replaces the cassette-type feeders 11 between the feeder conveyance conveyor 51 and the feeder stocking area 43 are provided at the bottom portion of the component mounting system 10.

The feeder conveyance conveyor 51 is provided to convey the cassette-type feeders 11, in a laterally prostrated state, in the same direction (the X-direction) as the conveyance direction of the circuit board conveyance conveyors 37. A stopper 53 for causing the cassette-type feeder 11 which is carried in to stop at a rear position of the feeder stocking area 43 is provided to be capable of being lifted and lowered on the feeder conveyance conveyor 51.

The replacing robot 52 is configured to include a clamp mechanism 54 which clamps the cassette-type feeder 11, a rotating mechanism 55 which causes the clamp mechanism 54 to rotate around a horizontal axis, and a moving mechanism 56 which causes the clamp mechanism 54 to move in the up-down direction, and the XY-directions (the horizontal directions).

Next, description will be given of the operations of the feeder conveyance conveyor 51 and the replacing robot 52. In a case in which the cassette-type feeder 11 with which the feeder stocking area 43 is restocked is placed on the conveyor 51 and carried in, the stopper 53 is caused to protrude upward, and the cassette-type feeder 11 is caused to stop at the rear position of the feeder stocking area 43. Subsequently, the replacing robot 52 is operated to clamp the cassette-type feeder 11, which is in a prostrated state on the feeder conveyance conveyor 51, using the clamp mechanism 54, the clamp mechanism 54 is lifted by the moving mechanism 56, the cassette-type feeder 11 is lifted up from the feeder conveyance conveyor 51, and the rotation space of the cassette-type feeder 11 is secured. Subsequently, after rotating the clamp mechanism 54 by 90° using the rotating mechanism 55 and rotating the cassette-type feeder 11 by 90° to set the cassette-type feeder 11 to a standing state, the clamp mechanism 54 is caused to move in a direction (the X-direction) which is parallel to the feeder conveyance conveyor 51 using the moving mechanism 56, the cassette-type feeder 11 is aligned with the position of an empty slot of the feeder stocking area 43, and the cassette-type feeder 11 is stored in the empty slot of the feeder stocking area 43.

On the other hand, in a case in which the used cassette-type feeder 11 is removed and carried out from the feeder stocking area 43, the stopper 53 is set to a state of being retracted downward, the used cassette-type feeder 11 of the feeder stocking area 43 is clamped and pulled out by the clamp mechanism 54, the clamp mechanism 54 is rotated by 90° using the rotating mechanism 55, and the cassette-type feeder 11 is changed from the standing state to the prostrated state, is placed on the feeder conveyance conveyor 51, and is carried out.

Figure 9:
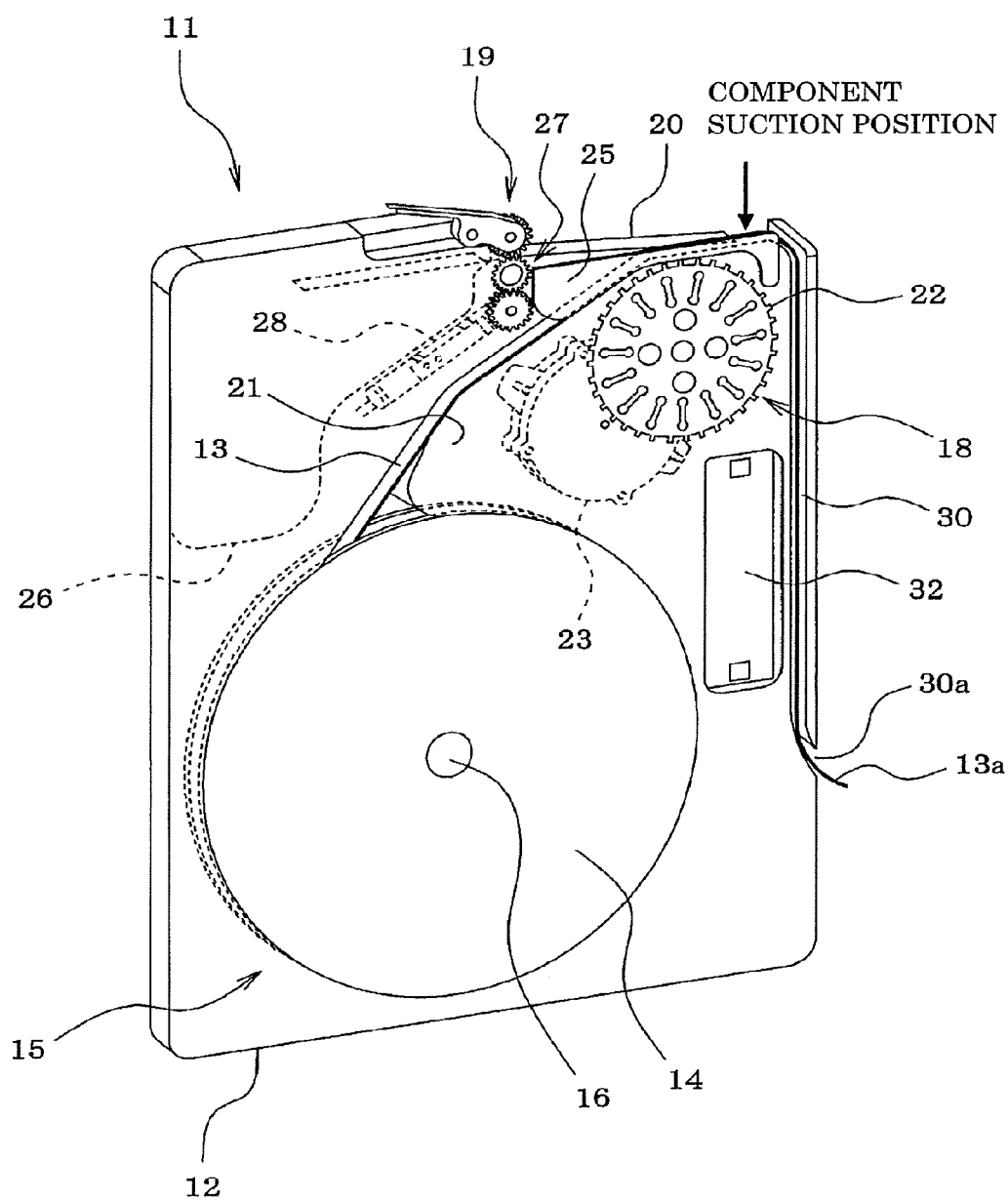
FIG. 9 is a perspective view illustrating a cassette-type feeder.

Next, description will be given of the configuration of the cassette-type feeder 11 based on FIG. 9. The cassette case 12 of the cassette-type feeder 11 is formed of a transparent or non-transparent plastic plate, a metal plate or the like, and the side face portion (the cover) is capable of being opened and closed. A tape loading section 15 is provided inside the cassette case 12, and a tape reel 14, on which a component supply tape 13 is wound, is loaded into the tape loading section 15 to be attachable and detachable (exchangeable). A reel holding shaft 16 which holds the tape reel 14 to be capable of rotating is provided at the center of the tape loading section 15.

A tape feeding mechanism 18 which feeds the component supply tape 13 which is pulled out from the tape reel 14 to the component suction position, and a top film peeling mechanism 19 which peels a top film 20 from the component supply tape 13 before the component suction position and exposes the component in the component supply tape 13 are provided inside the cassette case 12. The component suction position is positioned in the vicinity of the end portion of the tape feeding direction side of the upper face of the cassette case 12. A tape guide 21 which guides the component supply tape 13 which is pulled out from the tape reel 14 to the component suction position is provided inside the cassette case 12.

The tape feeding mechanism 18 is configured to include a sprocket 22 which is provided in the vicinity under the component suction position, a motor 23 which rotationally drives the sprocket 22, and the like, and the component supply tape 13 is pitch fed to the component suction position by causing the teeth of the sprocket 22 to mesh with tape feeding holes which are formed in the edge of one side of the component supply tape 13 at a predetermined pitch to cause the sprocket 22 to rotate.

The top film peeling mechanism 19 is formed from a tape retainer 25 for retaining the component supply tape 13 before the component suction position and peeling the top film 20 from the upper face of the component supply tape 13, a top film feed gear mechanism 27 which pulls the top film 20 which is peeled by a tape retainer 25 in an opposite direction from the tape feeding direction to feed the top film 20 into a top film collection section 26 which is provided on the top portion of the cassette case 12, a motor 28 which drives the top film feed gear mechanism 27, and the like.

A waste tape discharge passage 30 which guides waste tape 13a (in the present example, only the carrier tape from which the top film 20 is peeled), which passes the component suction position and from which the components are removed, downward and discharges the waste tape 13a is provided on the edge portion of the tape feeding direction side within the cassette case 12 to extend downward, and an outlet 30a of the waste tape discharge passage 30 is provided in a position closer to the bottom side than the center of the end surface of the tape feeding direction side of the cassette case 12. An air introduction port (not illustrated) is provided in the top portion of the waste tape discharge passage 30 so as to be open in the end surface of the tape feeding direction side within the cassette case 12, and is configured to allow air to enter the waste tape discharge passage 30 from the air introduction port and to cause a downward flow of the air within the waste tape discharge passage 30.

A control device 32 which controls the motor 23 of the tape feeding mechanism 18 and the motor 28 of the top film peeling mechanism 19 is provided within the cassette case 12. Although not depicted in the drawings, a connector for communication and power which is connected to the connector for communication and power of the automatic feeder exchanging system 34 (described later) side is provided in the cassette case 12.

An identification information recording section (not illustrated) which records or stores the feeder ID (the feeder identification information) is provided in a predetermined position of the cassette case 12. As the identification information recording section, for example, a code label in which the feeder ID is recorded as a bar code, a two-dimensional code, or the like may be used, and an electronic tag (also referred to as an RF tag, an IC tag, an electromagnetic wave tag, or a wireless tag) which stores the data of the feeder ID may be used.

As illustrated in FIG. 10, the control device 80 of the automatic feeder exchanging system 34 is connected to the production management device 70 of the component mounting system 10 by a network, the operations of the exchanging robot 45 are controlled based on production management information such as board type switching information and component shortage information which is transmitted from the production management device 70 of the component mounting system 10, and the cassette-type feeder 11 for which exchanging is necessary is removed from the feeder setting area 41 of each of the component mounting machines 35, and the cassette-type feeder 11 to be exchanged from among the multiple cassette-type feeders 11 waiting in the feeder stocking area 43 is removed to set the cassette-type feeder 11 in the feeder setting area 41 of the component mounting machine 35.

The production management device 70 of the component mounting system 10 functions as component remaining number management device which manages the remaining number of components of the cassette-type feeder 11 which is set in the feeder setting area 41 of each of the component mounting machines 35 in association with the feeders ID, and when the remaining number of components of any of the cassette-type feeders 11 reaches 0 (components depleted), it is determined that all of the components of the cassette-type feeder 11 are used up, and the component shortage information is output to the control device 80 of the automatic feeder exchanging system 34. Accordingly, the control device 80 of the automatic feeder exchanging system 34 controls the operations of the exchanging robot 45 based on the received component shortage information, the used (component-depleted) cassette-type feeder 11 is removed from the feeder setting area 41 of the component mounting machine 35, the cassette-type feeder 11 which supplies the same components as the used cassette-type feeder 11 is removed from the feeder stocking area 43 and is set in the feeder setting area 41 of the component mounting machine 35. In this manner, in a case in which the cassette-type feeder 11 which is removed from the feeder setting area 41 of the component mounting machine 35 is the partially-used cassette-type feeder 11 with the remaining components, the component remaining number is managed in association with the cassette-type feeder 11, and since the partially-used cassette-type feeder 11 may be collected and reused in the feeder stocking area 43, the components of the cassette-type feeder 11 may be used up to the last one, and the production cost may be reduced.

Upon receiving the substrate type board type switching information which is transmitted from the production management device 70 of the component mounting system 10, the control device 80 of the automatic feeder exchanging system 34 separates the cassette-type feeders 11 for which exchanging is necessary from among the cassette-type feeders 11 which are set in the feeder setting area 41 of each of the component mounting machines 35 into before and after the board type switching, and automatically performs the exchanging. For example, in a case in which the board type to be produced in each of the component mounting machines 35 is switched from a circuit board A to a circuit board B, as illustrated in FIG. 11A, the feeder exchange work before the board type switching is performed in parallel with the component mounting work onto the final circuit board A before the board type switching, and in the feeder exchange work before the board type switching, the cassette-type feeders 11 which are not used in the production (the circuit board B) after the board type switching, from among the cassette-type feeders 11 for which the supplying of the components which are necessary for the component mounting work onto the final circuit board A of the production during the production before the board type switching is completed, are sequentially removed from the feeder setting area 41 of the component mounting machine 35, are sequentially collected in the feeder stocking area 43, and the cassette-type feeders 11 which are used in the production (the circuit board B) after the board type switching are sequentially removed from the feeder stocking area 43 and are sequentially set in the feeder setting area 41 of the component mounting machine 35.

Incidentally, if the number of the cassette-type feeders 11 for which exchanging is necessary is small at the time of the board type switching, all of the cassette-type feeders 11 for which exchanging is necessary may be exchanged before the component mounting work onto the final circuit board A before the board type switching is completed; however, when the number of the cassette-type feeders 11 for which exchanging is necessary becomes large at the time of switching board types, there is a case in which the exchanging of only a portion of the cassette-type feeders 11 among the cassette-type feeders 11 for which exchanging is necessary may be performed before the component mounting work onto the final circuit board A before the board type switching is completed.

Even in this case, when the component mounting work onto the final circuit board A before the board type switching is completed, as illustrated in FIG. 11B, each of the component mounting machines 35 carries out the final circuit board A to the component mounting machine 35 of the downstream side, and carries in the first circuit board B from a previous step conveyor 99. At this time, even in a case in which the cassette-type feeders 11 for which exchanging is necessary are not yet exchanged and remain, the component mounting work onto the first circuit board B is started using the cassette-type feeders 11 which supply the components which are necessary for the production (the circuit board B) after the board type switching from among the multiple cassette-type feeders 11 which are set in the feeder setting area 41 of the component mounting machine 35. At this time, in a case in which the cassette-type feeders 11 for which exchanging is necessary remain after the board type switching in each of the component mounting machines 35, the exchanging robot 45 performs, in parallel with the component mounting work onto the first circuit board B after the board type switching, the feeder exchange work after the board type switching in which the cassette-type feeders 11 for which exchanging is necessary are removed from the feeder setting area 41 of the component mounting machine 35 and are collected in the feeder stocking area 43, and the cassette-type feeders 11 which are used in the production (the circuit board B) after the board type switching are removed from the feeder stocking area 43 and are set in the feeder setting area 41 of the component mounting machine 35.

In this manner, even in a case in which only a portion of the cassette-type feeder 11 among the cassette-type feeders 11 for which exchanging is necessary may be exchanged before the component mounting work onto the final circuit board A before the board type switching is completed, when the component mounting work onto the final circuit board A before the board type switching is completed, the final circuit board A is carried out to the component mounting machine 35 of the downstream side straight away, the first circuit board B after the board type switching is carried in, the component mounting work onto the first circuit board B is started, and since it is possible to perform the feeder exchange work after the board type switching which switches the remaining cassette-type feeders 11 in parallel with the component mounting work onto the first circuit board B after the board type switching, even in a case in which the cassette-type feeders 11 for which exchanging is necessary remain after the production before the board type switching is completed, it is possible to switch to the production (the circuit board B) after the board type switching straight away. Accordingly, the necessity to wait for the completion of the feeder exchange work in the switching from the production (the board type A) before the board type switching to the production (the circuit board B) after the board type switching is completely nullified, and it is possible to seamlessly switch the production.

In each of the component mounting machines 35, when the component mounting work onto the final circuit board A before the board type switching is completed, as illustrated in FIG. 11C, the final circuit board A is carried out to the component mounting machine 35 of the downstream side, the exchanging robot 45 is caused to move to the front face of the component mounting machine 35 of the downstream side, and the feeder exchange work before the board type switching and the feeder exchange work after the board type switching which are described above are performed on the component mounting machine 35 of the downstream side. By repeating the above operations, the feeder exchange work before the board type switching and the feeder exchange work after the board type switching are performed one component mounting machine 35 at a time in order to the downstream side from the component mounting machine 35 which is most upstream to the component mounting machine 35 which is most downstream of the component mounting system 10.

In this first embodiment which is described above, in a case in which the board type to be produced in each of the component mounting machines 35 is switched from the circuit board A to the circuit board B using the automatic feeder exchanging system 34 which automatically exchanges the cassette-type feeders 11 using the exchanging robot 45, the feeder exchange work before the board type switching is performed in parallel with the component mounting work onto the final circuit board A before the board type switching, and in the feeder exchange work before the board type switching, the cassette-type feeders 11 which are not used in the production (the circuit board B) after the board type switching, from among the cassette-type feeders 11 for which the supplying of the components which are necessary for the component mounting work onto the final circuit board A of the production during the production before the board type switching is completed, are removed from the feeder setting area 41 of the component mounting machine 35, and the cassette-type feeders 11 which are used in the production (the circuit board B) after the board type switching are set in the feeder setting area 41 of the component mounting machine 35, and thus, it is possible to swiftly perform the switching from the production (the mounting of components onto the circuit board A) before the board type switching to the production (the mounting of component onto the circuit board B) after the board type switching, and it is possible to improve the productivity.

Furthermore, in this first embodiment, even in a case in which the exchanging of only a portion of the cassette-type feeders 11 among the cassette-type feeders 11 for which exchanging is necessary may be performed before the component mounting work onto the final circuit board A before the board type switching is completed in each of the component mounting machines 35, when the component mounting work onto the final circuit board A before the board type switching is completed, each of the component mounting machines 35 carries out the final circuit board A straight away, carries in the first circuit board B after the board type switching, and at this time, starts the component mounting work onto the first circuit board B using the cassette-type feeders 11 which supply the components which are necessary for the production (the circuit board B) after the board type switching from among the multiple cassette-type feeders 11 which are set in the feeder setting area 41 of the component mounting machine 35, and since the feeder exchange work after the board type switching which exchanges the remaining cassette-type feeders 11 is performed, even in a case in which the cassette-type feeders 11 for which exchanging is necessary remain after the production before the board type switching is completed, it is possible to switch to the production (the circuit board B) after the board type switching straight away. Accordingly, the necessity to wait for the completion of the feeder exchange work in the switching from the production (the board type A) before the board type switching to the production (the circuit board B) after the board type switching is completely nullified, and it is possible to seamlessly switch the production.

However, in the present disclosure, in each of the component mounting machines 35, in a case in which only a portion of the cassette-type feeders 11 among the cassette-type feeders 11 for which exchanging is necessary may be exchanged before the component mounting work onto the final circuit board A before the board type switching is completed, the final circuit board A may be carried out after completing all of the work of exchanging the cassette-type feeders 11 for which exchanging is necessary, and in this case, it is not necessary to perform the feeder exchange work after the board type switching. Even in this case, by performing the feeder exchange work before the board type switching in parallel with the production (the component mounting onto the circuit board A) before the board type switching, it is possible to greatly shorten the wait time from the production (the mounting of components onto the circuit board A) before the board type switching until switching to the production (the mounting of components onto the circuit board B) after the board type switching, and it is possible to achieve anticipated object of the present disclosure.

Second Embodiment

Next, description will be given of the second embodiment of the present disclosure using FIG. 12. However, for portions which are effectively the same as in the first embodiment described above, description will be omitted or simplified, and description will mainly be given of different portions.

In the first embodiment described above, the feeder exchange work before the board type switching and the feeder exchange work after the board type switching are performed using the single exchanging robot 45; however, when the number of the cassette-type feeders 11 for which the exchanging is necessary becomes great, there is a case in which the feeder exchange work is not completed before the component mounting work onto the first circuit board B after the board type switching is completed.

Figure 12:
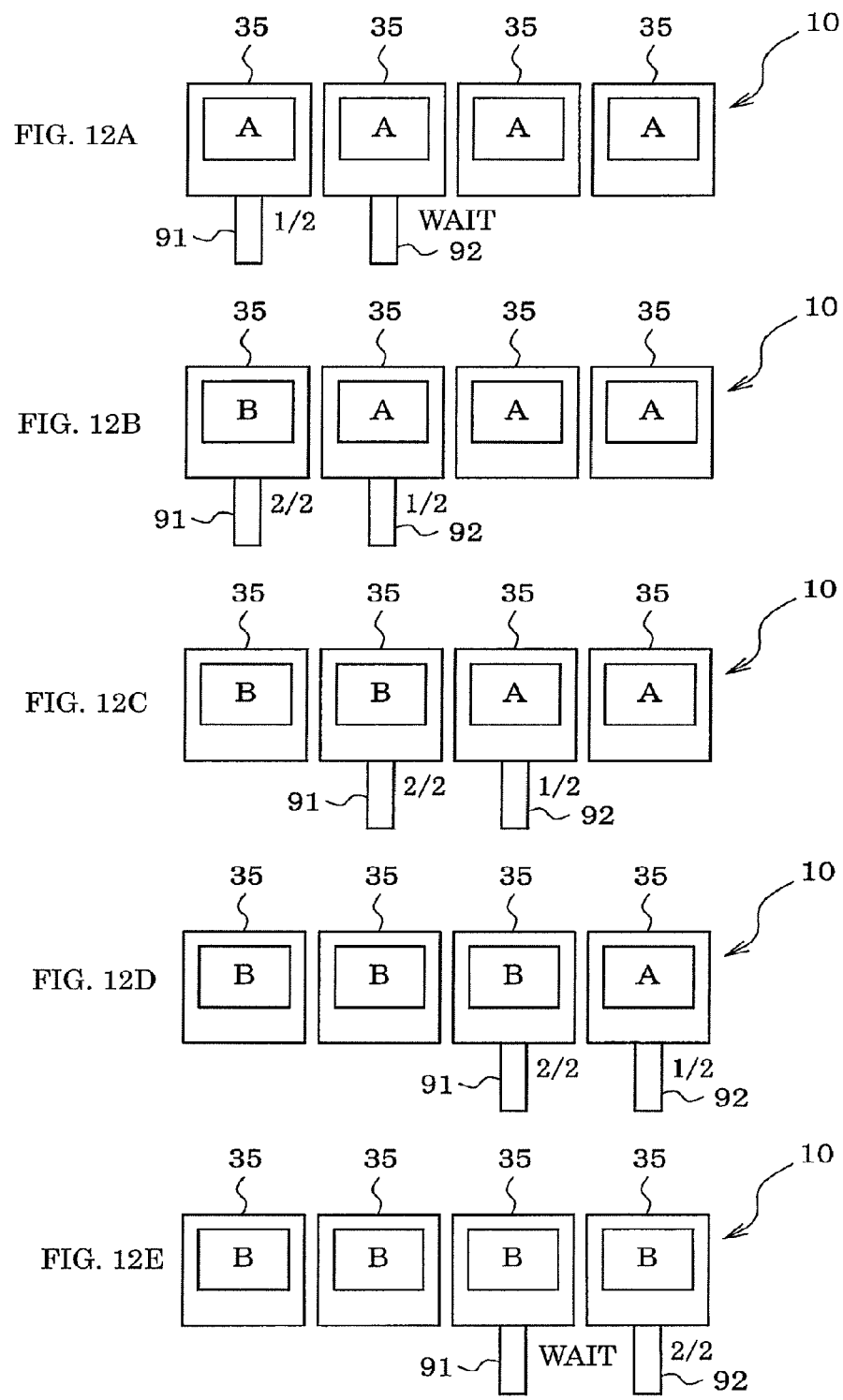
FIG. 12 is a diagram explaining a method of feeder exchange work before and after a switching of board type of a second embodiment.

As a countermeasure to this, in Example 2 of the present disclosure illustrated in FIG. 12, two exchanging robots (a first exchanging robot 91 and a second exchanging robot 92) which perform the feeder exchange work before and after the board type switching in relation to two adjacent component mounting machines 35 are provided, and, in parallel with an operation in which the feeder exchange work before the board type switching is performed using one of the exchanging robots (91 or 92) on the component mounting machine 35 into which the final circuit board A before the board type switching is carried, the feeder exchange work after the board type switching is performed using the other exchanging robot (92 or 91) on the component mounting machine 35 into which the first circuit board B after the board type switching is carried. The configuration of the two exchanging robots (the first exchanging robot 91 and the second exchanging robot 92) is the same as the configuration of the exchanging robot 45 which is described in the first embodiment.

In this second embodiment, half of the number of the cassette-type feeders 11 for which exchanging is necessary is exchanged in the feeder exchange work before the board type switching, and the remaining half of the cassette-type feeders 11 are exchanged in the feeder exchange work after the board type switching. However, the exchanging of the cassette-type feeders 11 for which exchanging is necessary may be repeated until the component mounting work onto the final circuit board A before the board type switching is completed, and the exchange work of the cassette-type feeders 11 may be performed in excess of half of the number of the cassette-type feeders 11 for which exchanging is necessary. In summary, the exchanging of the number of the cassette-type feeders 11 which may be exchanged may be performed in a range of time before the component mounting work onto the final circuit board A before the board type switching is completed.

As illustrated in FIG. 12, in parallel with two adjacent component mounting machines 35 performing the component mounting work onto the final circuit board A before the board type switching and the component mounting work onto the first circuit board B after the board type switching, the feeder exchange work before the board type switching and the feeder exchange work after the board type switching are performed at the same time using the first exchanging robot 91 and the second exchanging robot 92 on the two component mounting machines 35. Hereinafter, using FIG. 12, description will be given of the feeder exchange work before and after the board type switching in a case in which the component mounting system 10 is configured to include four of the component mounting machines 35, for example.

In a case in which the board type to be produced by the four component mounting machines 35 is switched from the circuit board A to the circuit board B, as illustrated in FIG. 12A, first, the first exchanging robot 91 is caused to move to the front face of the first (most upstream) component mounting machine 35, and the second exchanging robot 92 is caused to move to the front face of the second component mounting machine 35. When the final circuit board A before the board type switching is carried into the first component mounting machine 35 and the component mounting work onto the final circuit board A before the board type switching is being performed, the cassette-type feeders 11 which are not used in the production (the circuit board B) after the board type switching from among the cassette-type feeders 11, for which the supplying of the components which are necessary for the component mounting work onto the final circuit board A before the board type switching is completed, are sequentially removed from the feeder setting area 41 of the first component mounting machine 35 by the first exchanging robot 91, and are sequentially collected in the feeder stocking area 43. Due to the feeder exchange work before the board type switching, while the component mounting work onto the final circuit board A before the board type switching is being performed by the first component mounting machine 35, half of the number of the cassette-type feeders 11 for which exchanging is necessary is exchanged by the first exchanging robot 91. In this case, the second exchanging robot 92 does not perform the feeder exchange work and waits at the front face of the second component mounting machine 35.

Subsequently, when the component mounting work onto the final circuit board A before the board type switching is completed by the first component mounting machine 35, as illustrated in FIG. 12B, the final circuit board A before the board type switching is carried out from the first component mounting machine 35 to the second component mounting machine 35, and the first circuit board B after the board type switching is carried into the first component mounting machine 35. Subsequently, the component mounting work onto the first circuit board B is started by the first component mounting machine 35 using the cassette-type feeders 11 which supply the components which are necessary for the production (the circuit board B) after the board type switching, and the cassette-type feeders 11 which are used in the production (the circuit board B) after the board type switching are removed from the feeder stocking area 43 using the first exchanging robot 91, and are set in the feeder setting area 41 of the component mounting machine 35. Due to the feeder exchange work after the board type switching, while the component mounting work onto the first circuit board B after the board type switching is being performed by the first component mounting machine 35, the remaining half of the number of the cassette-type feeders 11 for which exchanging is necessary is exchanged by the first exchanging robot 91.

On the other hand, when the final circuit board A before the board type switching is carried into the second component mounting machine 35, the component mounting work onto the final circuit board A before the board type switching is started by the second component mounting machine 35, and the feeder exchange work before the board type switching is performed on the second component mounting machine 35 using the second exchanging robot 92. Accordingly, while the component mounting work onto the final circuit board A before the board type switching is being performed by the second component mounting machine 35, half of the number of the cassette-type feeders 11 for which exchanging is necessary is exchanged by the second exchanging robot 92.

Subsequently, when the component mounting work onto the final circuit board A before the board type switching is completed by the second component mounting machine 35, as illustrated in FIG. 12C, the final circuit board A before the board type switching is carried out from the second component mounting machine 35 to the third component mounting machine 35, and the first circuit board B after the board type switching is carried into the second component mounting machine 35. In parallel with this operation, the first exchanging robot 91 and the second exchanging robot 92 are caused to move to the front face of the second component mounting machine 35 and the third component mounting machine 35, respectively. In this state, the feeder exchange work after the board type switching is performed on the second component mounting machine 35 using the first exchanging robot 91, and the feeder exchange work before the board type switching is performed on the third component mounting machine 35 using the second exchanging robot 92.

Subsequently, when the component mounting work onto the final circuit board A before the board type switching is completed by the third component mounting machine 35, as illustrated in FIG. 12D, the final circuit board A before the board type switching is carried out from the third component mounting machine 35 to the fourth component mounting machine 35, and the first circuit board B after the board type switching is carried into the third component mounting machine 35. In parallel with this operation, the first exchanging robot 91 and the second exchanging robot 92 are caused to move to the front face of the third component mounting machine 35 and the fourth (most downstream) component mounting machine 35, respectively. In this state, the feeder exchange work after the board type switching is performed on the third component mounting machine 35 using the first exchanging robot 91, and the feeder exchange work before the board type switching is performed on the fourth (most downstream) component mounting machine 35 using the second exchanging robot 92.

Subsequently, when the component mounting work onto the final circuit board A before the board type switching is completed by the third component mounting machine 35, as illustrated in FIG. 12E, the final circuit board A before the board type switching is carried out from the fourth (most downstream) component mounting machine 35, and the first circuit board B after the board type switching is carried into the fourth component mounting machine 35. Subsequently, the feeder exchange work after the board type switching is performed on the fourth (most downstream) component mounting machine 35 using the second exchanging robot 92.

In this case, in the third component mounting machine 35 which the first exchanging robot 91 faces, since the feeder exchange work is already completed, the first exchanging robot 91 waits at the front face of the third component mounting machine 35 without performing the feeder exchange work.

In the present Example 2 which is described above, in parallel with two adjacent component mounting machines 35 performing the component mounting work onto the final circuit board A before the board type switching and the component mounting work onto the first circuit board B after the board type switching, it becomes possible to perform the feeder exchange work before the board type switching and the feeder exchange work after the board type switching at the same time using the first exchanging robot 91 and the second exchanging robot 92 on the two component mounting machines 35, and even in a case in which the number of the cassette-type feeders 11 for which exchanging is necessary is great to a certain degree, it is possible to seamlessly switch the production, and it is possible to increase the number of exchanges of the cassette-type feeders 11 for which it is possible to seamlessly switch the production.

The present disclosure is not limited to a configuration which uses the cassette-type feeder 11, and a configuration may be adopted in which a feeder that is not a cassette type is used, the configuration of the exchanging robot may be changed as appropriate, and the like, it goes without saying that the present disclosure may be carried out making various modifications within a scope that does not depart from the gist.

REFERENCE SIGNS LIST

10 . . . component mounting system, 11 . . . cassette-type feeder, 12 . . . cassette case, 13 . . . component supply tape, 13a . . . waste tape, 14 . . . tape reel, 15 . . . tape loading section, 16 . . . reel holding shaft, 18 . . . tape feeding mechanism, 19 . . . top film peeling mechanism, 21 . . . tape guide, 22 . . . sprocket, 25 . . . tape retainer, 26 . . . top film collection section, 27 . . . top film feed gear mechanism, 28 . . . motor, 30 . . . waste tape discharge passage, 32 . . . control device of cassette-type feeder, 34 . . . automatic feeder exchanging system, 35 . . . component mounting machine, 37 . . . conveyor, 38 . . . mounting head, 39 . . . XY-moving mechanism, 41 . . . feeder setting area, 42 . . . feeder switching area, 43 . . . feeder stocking area, 45 . . . exchanging robot, 51 . . . feeder conveyance conveyor, 52 . . . replacing robot, 60 . . . control device of component mounting machine, 61 . . . identification information reading section, 65 . . . storage device, 66 . . . display device, 70 . . . production management device of component mounting system (component remaining number management device), 71 . . . X-axis rail, 72 . . . X-axis motor, 76 . . . feeder transfer section, 77 . . . clamp member, 78 . . . Y-axis motor, 79 . . . Y-axis guide member, 80 . . . control device of automatic feeder exchanging system, 81 . . . Z-axis guide member, 82 . . . Z-axis motor, 91 . . . first exchanging robot, 92 . . . second exchanging robot FIG. 10
64: INPUT DEVICE
65: STORAGE DEVICE
66: DISPLAY DEVICE
37: CONVEYOR
39: XY-MOVING MECHANISM
63: IMAGING DEVICE
45: EXCHANGING ROBOT
61: IDENTIFICATION INFORMATION READING SECTION
60: CONTROL DEVICE OF COMPONENT MOUNTING MACHINE
70: PRODUCTION MANAGEMENT DEVICE OF COMPONENT MOUNTING SYSTEM
80: CONTROL DEVICE OF AUTOMATIC FEEDER EXCHANGING SYSTEM
32: CONTROL DEVICE OF CASSETTE-TYPE FEEDER
51: FEEDER CONVEYANCE CONVEYOR
52: REPLACING ROBOT
FIG. 11
CASSETTE-TYPE FEEDERS EXCHANGED BEFORE BOARD TYPE SWITCHING
CASSETTE-TYPE FEEDERS EXCHANGED AFTER BOARD TYPE SWITCHING
CASSETTE-TYPE FEEDERS COMMONLY USED BEFORE AND AFTER BOARD TYPE SWITCHING

The invention claimed is:

1. A component mounting system including multiple feeders configured to be exchanged in respective a feeder setting area of respective multiple component mounting machines which are arranged along a conveyance path of a circuit board, the circuit board being conveyed to the multiple component mounting machines in order and components which are supplied from the multiple feeders are mounted onto the circuit board using each of the component mounting machines to produce a component mounted board, the component mounting system comprising:

a feeder stocking area including feeders to be exchanged with feeders for which exchanging is necessary from among the multiple feeders set in the feeder setting area of each of the component mounting machines;

an exchanging robot which removes the feeders for which exchanging is necessary from the feeder setting area of each of the component mounting machines, sets the feeders for which exchanging is necessary in the feeder stocking area, removes the feeders to be exchanged from in the feeder stocking area, and sets the feeders to be exchanged in the feeder setting area of the respective component mounting machine; and a control device configured to control the exchanging robot when a board type to be produced in each of the component mounting machines is switched from a first board type to a second board type, to perform a feeder exchange process before a board type switching in parallel with a component mounting process onto a final circuit board of the first board type, wherein in the feeder exchange process before the board type switching, the control device controls the exchanging robot to remove feeders from the feeder setting area which are not used in production of the second board type among feeders necessary for the component mounting process onto the final circuit board of the first board type and to set the feeders which are not used in the production of the second board type in the feeder stocking area, and to remove feeders to be used in the production of the second board type from the feeder stocking area and sets the feeders to be used in the production of the second board type in the feeder setting area of the component mounting machine.

2. The component mounting system according to claim 1, wherein two exchanging robots which perform the feeder exchange process before and after the board type switching in relation to two adjacent component mounting machines are provided, and, in parallel with an operation in which the feeder exchange process before the board type switching is performed using one of the two exchanging robots on the component mounting machine into which the final circuit board of the first board type is carried, the feeder exchange process after the board type switching is performed using the other of the two exchanging robots on the component mounting machine into which a first circuit board of the second board type is carried.

3. The component mounting system according to claim 1, wherein an identification information recording section which records or stores feeder identification information is provided in each of the feeders, wherein the feeder stocking area includes an identification information reading section which reads the feeder identification information from the identification information recording section of the feeders to be exchanged, and wherein the exchanging robot identifies one of the feeders to be exchanged based on the feeder identification information which is transmitted from the identification information reading section.

4. The component mounting system according to claim 3, further comprising:

component remaining number management device to manage a number of remaining components on the feeders which are set in the feeder setting area of each of the component mounting machines in association with the feeder identification information, wherein the exchanging robot removes used feeders for which it is determined that all components are used up based on management information of the component remaining number management means in each of the component mounting machines from the feeder setting area of the component mounting machine, removes replacement feeders which supply the same components as the used feeders from the feeder stocking area, and sets the replacement feeders in the feeder setting area of the component mounting machine.

5. The component mounting system according to claim 1, further comprising:

a feeder conveyance conveyor which performs carrying in of restock feeders with which to restock the feeder stocking area and carrying out of used feeders; and a replacing robot which replaces the restock feeders and the used feeders between the conveyor and the feeder stocking area.

6. The component mounting system according to claim 1, wherein each of the feeders is a cassette-type feeder including a tape loading section into which a wound component supply tape is loaded, a tape feeding mechanism which feeds the component supply tape which is pulled out from the tape loading section to a component suction position, a top film peeling mechanism which peels a top film from the component supply tape before the component suction position and exposes components inside the component supply tape, and a cassette case which houses the tape loading section, the tape feed mechanism, and the top film peeling mechanism.

7. A component mounting method which sets multiple feeders configured to be exchanged in a feeder setting area of respective multiple component mounting machines which are arranged along a conveyance path of a circuit board, conveys the circuit board to the multiple component mounting machines in order and mounts components which are supplied from the multiple feeders onto the circuit board using each of the component mounting machines to produce a component mounted board, the method comprising:

providing in a feeder stocking area feeders to be exchanged with feeders for which exchanging is necessary from among the multiple feeders set in the feeder setting area of each of the component mounting machines; and removing via an exchanging robot the feeders for which exchanging is necessary from the feeder setting area of each of the component mounting machines;

setting the feeders for which exchanging is necessary in the feeder stocking area;

removing the feeders to be exchanged from the feeder stocking area; and setting the feeders to be exchanged in the feeder setting area of the respective component mounting machine, wherein when a board type to be produced in each of the component mounting machines is switched from a first board type to a second board type, the exchanging robot performs a feeder exchange process before a board type switching in parallel with a component mounting process onto a final circuit board of the first board type, and wherein in the feeder exchange process before the board type switching, the exchanging robot removes feeders from the feeder setting area which are not used in production of the second board type among feeders necessary for the component mounting process onto the final circuit board of the first board type and sets the feeders which are not used in the production of the second board type in the feeder stocking area, and removes feeders to be used in the production of the second board type from the feeder stocking area and sets the feeders to be used in the production of the second board type in the feeder setting area of the component mounting machine.

* * * * *